US009392152B2

(12) United States Patent
Kim

(10) Patent No.: US 9,392,152 B2
(45) Date of Patent: Jul. 12, 2016

(54) CAMERA MODULE WITH A VARIABLE LENS

(71) Applicant: LG INNOTEK CO., LTD., Seoul (KR)

(72) Inventor: Min Soo Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/888,105

(22) Filed: May 6, 2013

(65) Prior Publication Data

US 2013/0293772 A1 Nov. 7, 2013

(30) Foreign Application Priority Data

May 7, 2012 (KR) ........................ 10-2012-0047956

(51) Int. Cl.

*H04N 3/14* (2006.01)
*H04N 5/225* (2006.01)
*G02B 7/09* (2006.01)
*G03B 3/10* (2006.01)
*G02B 3/14* (2006.01)
*G02B 5/20* (2006.01)

(52) U.S. Cl.

CPC ................ *H04N 5/2254* (2013.01); *G02B 7/09* (2013.01); *G03B 3/10* (2013.01); *G02B 3/14* (2013.01); *G02B 5/208* (2013.01)

(58) Field of Classification Search

CPC H04N 5/23241; H04N 5/2251; H04N 5/2254

USPC .................................................. 348/373–375

See application file for complete search history.

(56) References Cited

U.S. PATENT DOCUMENTS 7,893,992 B2 * 2/2011 Vittu ............................ 348/374
8,717,487 B2 * 5/2014 Azuma ......................... 348/340
2007/0047938 A1 * 3/2007 Suzuki et al. ................... 396/89
2007/0086769 A1 * 4/2007 Watanabe et al. ............. 396/133
2008/0044172 A1 * 2/2008 Tang et al. ...................... 396/89
2009/0015706 A1 * 1/2009 Singh ..................... G03B 17/00 348/340
2009/0141232 A1 * 6/2009 Cheng et al. .................. 349/200
2010/0103542 A1 * 4/2010 Yasuda .................... G02B 7/08 359/824
2011/0304914 A1 * 12/2011 Gutierrez et al. ............. 359/554
2011/0315772 A1 * 12/2011 Shi .......................... 235/462.25
2013/0002894 A1 * 1/2013 Lee ......................... 348/208.99
2013/0300918 A1 * 11/2013 Lipson et al. ................. 348/357

* cited by examiner

*Primary Examiner* — Sinh Tran
*Assistant Examiner* — Selam T Gebriel
(74) *Attorney, Agent, or Firm* — Birch, Stewart, Kolasch & Birch, LLP

(57) ABSTRACT

An exemplary embodiment of the present disclosure includes a PCB mounted with an image sensor, a base installed at an upper surface of the PCB to centrally form an optical path, a lens holder coupled to an upper surface of the base to form an optical path by being mounted with at least one or more sheets of lenses, a variable lens arranged on the optical path centrally formed at the base to control a refractive index of passing light, and an infrared cut-off coating layer provided on a surface of the variable lens to filter an infrared component from the optical path-passing light.

16 Claims, 3 Drawing Sheets

31
32
30
41
40
50
20
13
12
11
10

CAMERA MODULE WITH A VARIABLE LENS

Pursuant to 35 U.S.C. §119 (a), this application claims the benefit of earlier filing date and right of priority to Korean Patent Application No. 10-2012-0047956, filed on May 7, 2012, the contents of which are hereby incorporated by reference in their entirety.

BACKGROUND OF THE DISCLOSURE

1. Field of Endeavor

The teachings in accordance with exemplary and non-limiting embodiments of this disclosure relate generally to a camera module.

2. Background

In a case an auto focusing operation is carried out in a conventional camera module, an auto focus terminal and a PCB auto focus pad must be conductibly connected to drive an actuator, which is disadvantageously susceptible to shock.

Particularly, development of a camera module configured to maintain an auto focusing function and handshake compensation function, and yet to minimize a height of the camera module is required by a user needs to a slimmer camera module installed on small-sized electronic products such as notebooks, smart phones and tablet personal computers.

SUMMARY OF THE DISCLOSURE

In one general aspect of the present disclosure, there is provided a camera module, the camera module comprising: a PCB (Printed Circuit Board) mounted with an image sensor; a base installed at an upper surface of the PCB to centrally form an optical path; a lens holder coupled to an upper surface of the base to form an optical path by being mounted with at least one or more sheets of lenses; a variable lens arranged on the optical path centrally formed at the base to control a refractive index of passing light; and an infrared cut-off coating layer provided on a surface of the variable lens to filter an infrared component from the optical path-passing light.

Preferably, but not necessarily, the camera module may further comprises an actuator controlling the variable lens.

Preferably, but not necessarily, the lens holder and the base may be integrally formed.

Preferably, but not necessarily, the infrared cut-off coating layer may be formed on any one surface of the lenses.

Preferably, but not necessarily, the actuator may include any one of a MEMS actuator moved by using an electrostatic force and a piezoelectric force, a non-MEMS actuator like a liquid crystal lens and a piezoelectric polymer lens, a silicon type actuator, and a liquid lens.

Preferably, but not necessarily, the actuator may include a combination of at least two of a MEMS actuator moved by using an electrostatic force and a piezoelectric force, a non-MEMS actuator like a liquid crystal lens and a piezoelectric polymer lens, a silicon type actuator, and a liquid lens.

Preferably, but not necessarily, the actuator may be connected to the PCB via a wiring member to exchange an electric power and a control signal.

Preferably, but not necessarily, the wiring member may be provided with an F-PCB (Flat PCB).

Preferably, but not necessarily, the wiring member may be formed with an F-PCB having a plurality of terminal units to be connected to a controller mounted on the PCB.

Preferably, but not necessarily, the wiring member may be provided with an electronic circuit pattern layer integrally formed with the lens holder and the base.

Preferably, but not necessarily, the lens holder may include at least one or more sheets of lenses, and an optical mechanism arranged on an optical path formed by the lens to adjust the passing light.

Preferably, but not necessarily, the optical mechanism may include an aperture and a shutter.

Preferably, but not necessarily, the optical mechanism may be interposed between any one space formed by an extreme outer lens supported by the actuator and the lens opposite to the extreme outer lens, a space formed by the image sensor and a lens opposite to the image sensor and a space formed by the plurality of lenses.

Exemplary embodiments of the present disclosure have an advantageous effect in that handshake compensation function and auto focusing function can be performed by changes in refractive indexes of passing light through changes in fixed lens thickness free from horizontal, vertical and tilting movement of a lens, and a height of a camera module can be reduced to enable a miniaturization of the camera module.

BRIEF DESCRIPTION OF THE DRAWINGS

In order to explain the principle of the present disclosure, some accompanying drawings related to its preferred embodiments are below reported for the purpose of illustration, exemplification and description, although they are not intended to be exhaustive. In the figures, like reference numerals refer to the same or similar elements.

DETAILED DESCRIPTION

Hereinafter, exemplary embodiments of the present disclosure will be described in detail with reference to the accompanying drawings.

Figure 1:
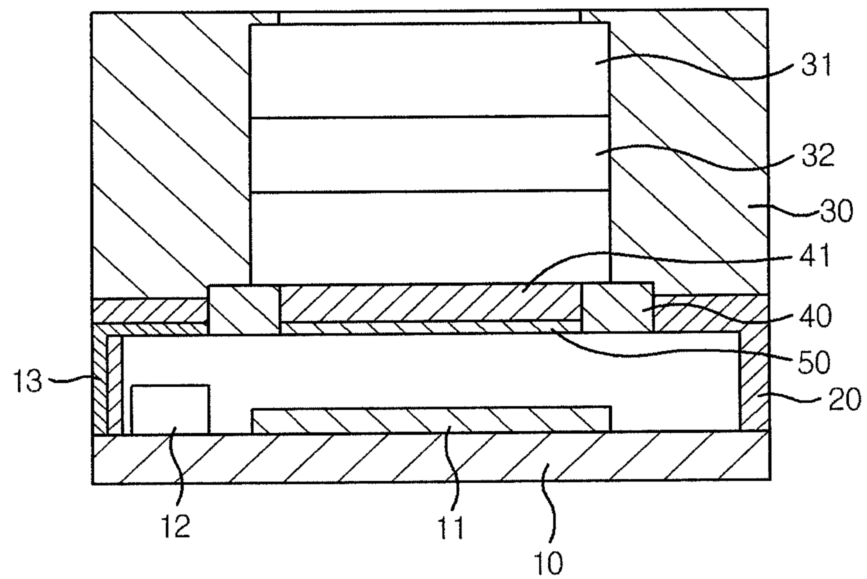
FIG. 1 is a schematic lateral cross-sectional view illustrating a camera module according to a first exemplary embodiment of the present disclosure.
Figure 2:
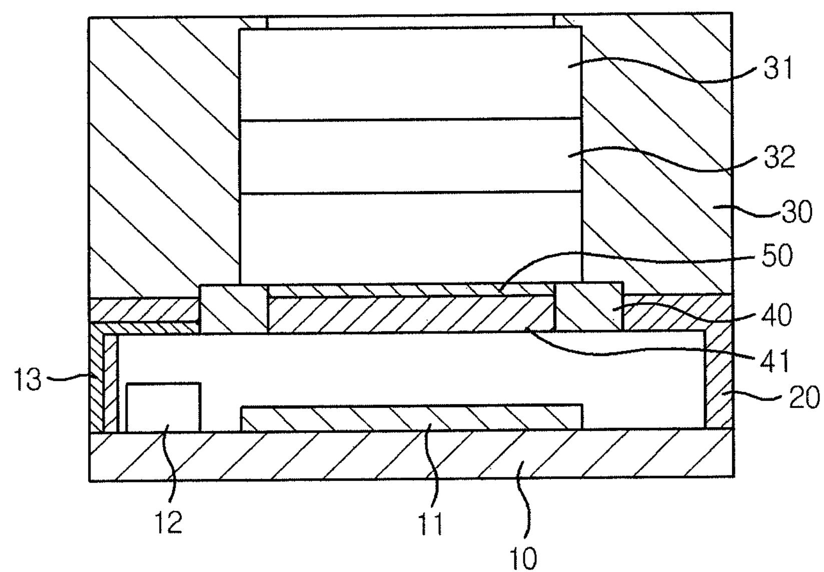
FIG. 2 is a schematic lateral cross-sectional view illustrating a camera module according to a second exemplary embodiment of the present disclosure.
Figure 3:
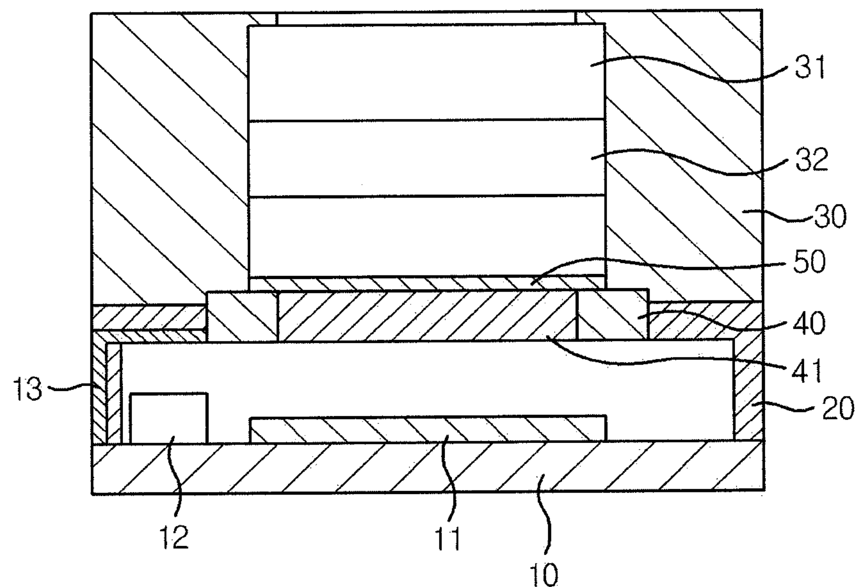
FIG. 3 is a schematic lateral cross-sectional view illustrating a camera module according to a third exemplary embodiment of the present disclosure.
Figure 4:
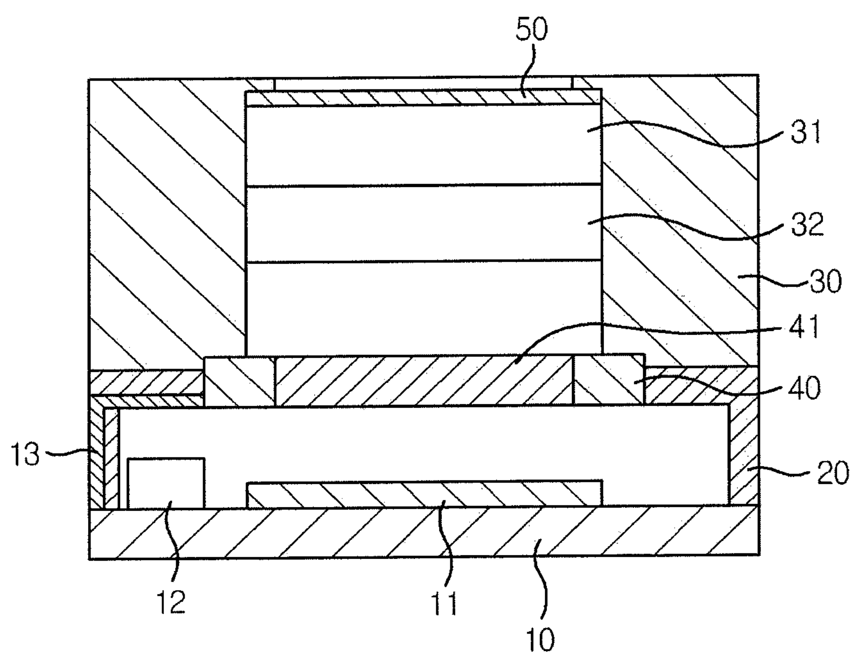
FIG. 4 is a schematic lateral cross-sectional view illustrating a camera module according to a fourth exemplary embodiment of the present disclosure.
Figure 5:
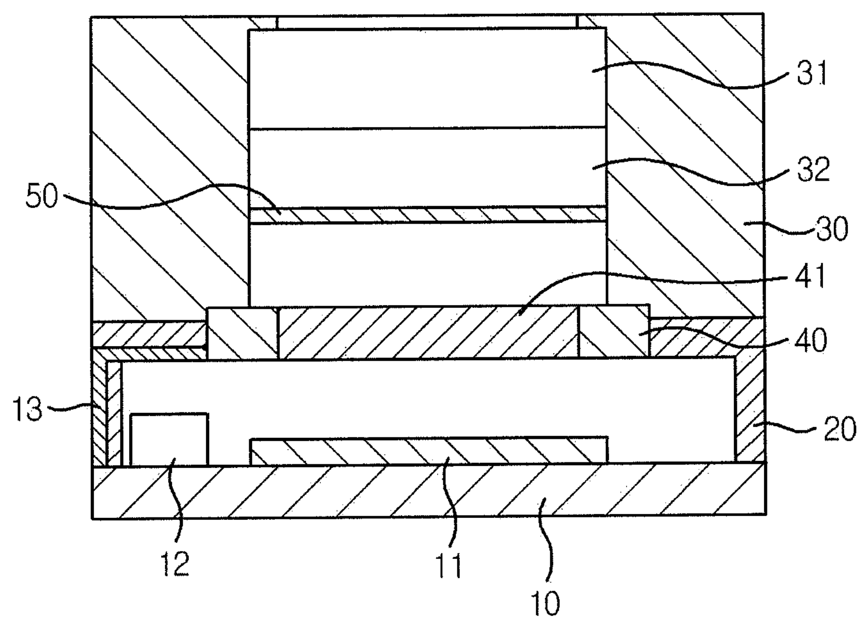
FIG. 5 is a schematic lateral cross-sectional view illustrating a camera module according to a fifth exemplary embodiment of the present disclosure.

FIG. 1 is a schematic lateral cross-sectional view illustrating a camera module according to a first exemplary embodiment of the present disclosure, FIG. 2 is a schematic lateral cross-sectional view illustrating a camera module according to a second exemplary embodiment of the present disclosure, FIG. 3 is a schematic lateral cross-sectional view illustrating a camera module according to a third exemplary embodiment of the present disclosure, FIG. 4 is a schematic lateral cross-sectional view illustrating a camera module according to a fourth exemplary embodiment of the present disclosure, and FIG. 5 is a schematic lateral cross-sectional view illustrating a camera module according to a fifth exemplary embodiment of the present disclosure.

Referring to FIG. 1, a camera module according to an exemplary embodiment of the present disclosure includes a PCB 10, a base 20, a lens holder 30, an actuator 40, and a variable lens 41 where the base 20 and the lens holder 30 may be integrally formed.

The PCB 10 may be formed with an image sensor 11 at an approximate center thereof to read out image information, and may be mounted at a surface thereof with the image sensor 11 and a controller 12 outputting data and a control signal of the actuator 40. At this time, the actuator 40 and the PCB 10 may be conductibly connected via a wiring member 13, where the wiring member 13 may be provided with an F-PCB (Flexible PCB), or may be formed with an electronic circuit pattern layer formed on a surface of the base 20 by using an Interconnection technology.

The base 20 may be stacked on an upper surface of the PCB 10 to perform a function of supporting a structure of the camera module. It is preferable that the base 20 be stacked at an upper surface with the lens holder 30, the variable lens 41 and the actuator 40 arranged on an optical path formed at an approximate center thereof, the actuator downwardly face the image sensor 11 and oppositely face the lens holder 30.

The lens holder 30 is centrally and sequentially arranged with at least one or more sheets of lenses 31 to capture an external image toward the image sensor 11. At this time, the lenses 31 may be installed in the middle thereof with a separate optical mechanism 32 including a shutter unit and an aperture, if necessary.

That is, the lens holder 30 may be sequentially arranged with at least one or more sheets of lenses, and in a case two lenses are arranged on an optical path formed inside the lens holder 30, the aperture and the shutter unit may be arranged at a space between two lenses as shown in the drawing, at a space between the lens 31 and the actuator 40, or at an upper surface of an extreme outer lens 31 or at a downward of the lens 31. This arranged relationship may be changed in response to a product design and configuration of camera unit. Preferably, wiring is configured with parts replacing the base 20 and the lens holder 30. Of course, the base 20 and the lens holder 30 may be integrally formed. In this case, a process of attaching and fixing the base 20 and the lens holder 30 together may be omitted.

The actuator 40 is fixedly installed on the base 20, and preferably, the actuator 40 downwardly faces the image sensor 11 and oppositely faces the extreme downward lens 31 among the plurality of lenses 31, as illustrated in the drawing.

The actuator 40 may be used with various structures, and according to an exemplary embodiment of the present disclosure, the actuator 40 may be formed to control one sheet of variable lens 41, where the actuator 40 is fixed and needs no movement. At this time, the variable lens 41 may be configured with an LC (Liquid crystal) lens, a liquid lens or a piezoelectric polymer lens. In the case of these types of lenses, it is understood that the control would include providing signals or electric power to the lens without displacement of the lens.

The present disclosure is characterized by an infrared cut-off coating layer 50 configured on any one of the constituent elements forming the actuator 40 thus described to dispense with a separate infrared cut-off filter member. Thus, a surface opposite to the image sensor 11 of the variable lens 41 may be formed with the infrared cut-off coating layer 50. In a case an infrared cut-off coating function is performed on the variable lens 41 free from the separate infrared cut-off filter, an assembly process can be reduced, and a height of a camera module can be lowered due to no need of a separate infrared cut-off filter.

Meanwhile, FIG. 2 is a schematic lateral cross-sectional view illustrating a camera module according to a second exemplary embodiment of the present disclosure, where the infrared cut-off coating layer 50 is formed on a surface opposite to the lens 31 of the lens holder 30.

In the second exemplary embodiment of the present disclosure, although the infrared cut-off coating layer 50 is formed on a surface of one sheet of variable lens 41 controlled by the actuator 40, as in the first exemplary embodiment of the present disclosure, only difference is that position of the surface is different while other configuration is same.

In other exemplary embodiment of the present disclosure, as illustrated in FIG. 3, it is possible to form the infrared cut-off coating layer 50 on a surface of an extreme rear lens of the lens holder 30, and as in FIG. 4, it is possible to form the infrared cut-off coating layer 50 on a surface of a first lens of the lens holder 30, and as in FIG. 5, it is possible to form the infrared cut-off coating layer 50 on any one lens of the plurality of lenses 31 installed on the lens holder 31. Alternatively, instead of coating on the lens 31, an existing infrared cut-off filter member may be formed inside a space unit. That is, any one surface of a lens in the plurality of lenses may be coated, or a separate infrared cut-off filter member may be used.

Meanwhile, although the abovementioned exemplary embodiments of the present disclosure have described and illustrated that the actuator 40 is formed with the variable lens 41 of an LC lens, and refraction of passing light is changed, without physically moving one sheet of lens, to perform auto focusing and handshake compensating functions, it should be apparent that the present disclosure is not limited thereto.

The actuator 40 may be so configured as to perform a zooming function and +a shutter function in addition to the auto focusing and handshake compensating functions. Furthermore, the actuator 40 may be replaced by any actuator capable of controlling one sheet of lens such as an actuator using a piezoelectric polymer and movable by using electrostatic force or a piezoelectric force.

That is, by way of non-limiting example, the actuator may be any one of a MEMS (Micro-electromechanical Systems) actuator capable of moving one sheet of lens using the electrostatic force and the piezoelectric force, a MEMS piezoelectric actuator, a MEMS bimorph actuator, an MEMS thermal actuator, a MEMS magnetic actuator, a MEMS liquid actuator, a non-MEMS type actuator, a silicon type actuator, and a liquid lens, or any type of actuator that is configured by combination thereof.

As apparent from the foregoing according to exemplary embodiments of the present disclosure, the infrared cut-off coating layer 50 capable of functioning as an infrared cut-off filter is arranged on a surface of the variable lens 41 to reduce a possibility of a camera module being damaged by external shock and to thereby enhance reliability of the camera module.

Furthermore, a same height as that of a fixed focus camera module mounted with a conventional infrared cut-off filter can be maintained, or a height lower than that of the fixed focus camera module mounted with a conventional infrared cut-off filter can be configured, whereby lenses can be co-used for immediate application to the manufacturing process.

Still furthermore, instead of disposing an entire camera module during re-work or occurrence of defects, an error of a relevant part can be selectively corrected to allow management as that of the fixed focus camera module, and error rate caused by foreign objects that may happen during the manufacturing process can be reduced to increase a yield rate as that of the fixed focus camera module.

Although the present disclosure has been described with reference to a number of illustrative embodiments thereof, it should be understood that numerous other modifications and embodiments can be devised by those skilled in the art that will fall within the spirit and scope of the principles of this disclosure.

What is claimed is:

1. A camera module, the camera module comprising:

a printed circuit board (PCB) mounted with an image sensor;

a base disposed on an upper surface of the PCB to centrally form an opening;

a lens holder coupled to an upper surface of the base and having a plurality of lenses arranged on an optical path inside the lens holder;

a variable lens fixedly arranged between an extreme rear lens of the plurality of lenses in the optical path and the base to change refractive index of passing light;

an actuator disposed between the lens holder and the image sensor to control the variable lens; and an infrared cut-off coating layer to filter an infrared component from the passing light, wherein the actuator has a ring shape and is coupled to an inner periphery of the opening formed in the base, wherein the actuator is conductibly connected to the PCB and provides a control signal or an electric power for the variable lens, wherein the variable lens is coupled inside the ring-shaped actuator, and wherein a surface of any one of the variable lens and the plurality of lenses is coated with the infrared cut-off coating layer.

2. The camera module of claim 1, wherein the lens holder and the base are integrally formed.

3. The camera module of claim 1, wherein the actuator includes any one of a micro-electromechanical systems (MEMS) actuator moved by using an electrostatic force or a piezoelectric force, an actuator for a piezoelectric polymer lens, or a silicon type actuator.

4. The camera module of claim 1, wherein the actuator includes combination of at least two of a micro-electromechanical systems (MEMS) actuator moved by using an electrostatic force or a piezoelectric force, an actuator for a piezoelectric polymer lens, or a silicon type actuator.

5. The camera module of claim 1, wherein the actuator is connected to the PCB via a wiring member to exchange an electric power and a control signal.

6. The camera module of claim 5, wherein the wiring member is provided with a flexible printed circuit board (F-PCB).

7. The camera module of claim 5, wherein the wiring member is formed with the F-PCB having a plurality of terminal units to be connected to a controller mounted on the PCB.

8. The camera module of claim 5, wherein the wiring member is provided with an electronic circuit pattern layer integrally formed with the lens holder and the base.

9. The camera module of claim 1, wherein the lens holder includes an optical mechanism arranged on the optical path formed by the at least one or more lenses to adjust the passing light.

10. The camera module of claim 9, wherein the optical mechanism includes an aperture and a shutter.

11. The camera module of claim 9, wherein the optical mechanism is placed in one of a space outside the outermost lens of the plurality of lenses, a space between the plurality of lenses, a space between the variable lens and a lens of the plurality of lenses neighboring the variable lens, and a space between the image sensor and a lens of the plurality of lenses or the variable lens neighboring the image sensor.

12. The camera module of claim 1, further comprising an actuator configured to move the variable lens along the optical path to provide a zooming function.

13. The camera module of claim 1, wherein the infrared cut-off coating layer is formed on a bottom surface of the variable lens.

14. The camera module of claim 1, wherein the infrared cut-off coating layer is formed on an upper surface of the variable lens.

15. The camera module of claim 1, wherein the infrared cut-off coating layer is formed on a bottom surface of the extreme rear lens.

16. The camera module of claim 1, wherein the infrared cut-off coating layer is formed on an upper surface of a first lens.

* * * * *